United States Patent [19]
Matsushita et al.

[11] Patent Number: 6,066,579
[45] Date of Patent: *May 23, 2000

[54] HYDROGEN HEAT TREATMENT METHOD OF SILICON WAFERS USING A HIGH-PURITY INERT SUBSTITUTION GAS

[75] Inventors: Junichi Matsushita; Jun Yoshikawa, both of Kanagawa; Masayuki Sanada, Niigata; Tatsuya Shimizu, Yamagata, all of Japan

[73] Assignee: Toshiba Ceramics Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/781,026

[22] Filed: Jan. 9, 1997

[51] Int. Cl.[7] .................................................. H01L 21/324
[52] U.S. Cl. ......................... 438/795; 438/799; 438/715; 438/660; 438/913
[58] Field of Search .............................. 437/247; 438/799, 438/715, 660, 913, 795, FOR 407, FOR 408

[56] References Cited

U.S. PATENT DOCUMENTS

| | | | |
|---|---|---|---|
| 3,753,758 | 8/1973 | Shanley | 117/25 |
| 3,775,151 | 11/1973 | Baker et al. | 117/107.2 |
| 4,042,426 | 8/1977 | Beiser | 428/667 |
| 5,003,375 | 3/1991 | Ichikawa | 357/71 |
| 5,508,207 | 4/1996 | Horai et al. | 437/13 |
| 5,534,294 | 7/1996 | Kubota et al. | 427/255 |
| 5,829,139 | 5/1995 | Murphy et al. | 427/244 |

FOREIGN PATENT DOCUMENTS 408008264  1/1996  Japan.

*Primary Examiner*—Chandra Chaudhari
*Assistant Examiner*—Thanh Nguyen
*Attorney, Agent, or Firm*—Finnegan, Henderson, Farabow, Garrett & Dunner, L.L.P.

[57] ABSTRACT

A heat treatment is performed in a hydrogen-gas containing atmosphere. A high-purity inert gas having a water content of not more than 2.57 ppm is used as a substitution gas for replacing a wafer-input air atmosphere and for replacing the hydrogen-gas containing atmosphere after the heat treatment.

5 Claims, 4 Drawing Sheets

HYDROGEN HEAT TREATMENT METHOD OF SILICON WAFERS USING A HIGH-PURITY INERT SUBSTITUTION GAS

BACKGROUND OF THE INVENTION

1. Field of the Invention

The present invention relates to a manufacturing method of a silicon wafer for semiconductor devices and, more specifically, to a silicon wafer manufacturing method in which silicon wafers are subjected to a heat treatment in an atmosphere containing hydrogen.

2. Description of the Related Art

In the silicon wafer manufacture, it is a conventional technique to reduce the oxygen concentration of an active layer close to the wafer surface where semiconductor devices are to be formed by performing a heat treatment in an hydrogen atmosphere or a mixed atmosphere of a hydrogen gas and an inert gas (in the following, both atmospheres are referred to as a hydrogen-gas containing atmosphere), and to thereby eliminate almost completely precipitation defects due to oxygen precipitation, such as BMD. (Refer to, for instance, Nikkei Microdevices, June 1993, pp. 46–55.)

In performing a heat treatment on silicon wafers (in the following, also simply called wafers) in a hydrogen-gas containing atmosphere, the closest attention is paid to avoid hydrogen explosion. For example, a heat treatment is performed according to the following procedure.

Step 1: The inside of a furnace is opened to the air.

Step 2: Wafers are introduced into the furnace.

Step 3: After the furnace is closed, the intrafurnace atmosphere is replaced by a nitrogen gas.

Step 4: After oxygen is completely eliminated from the furnace, a hydrogen gas is introduced into the furnace and substituted for the nitrogen gas.

Step 5: A heat treatment is started.

Step 6: After completion of the heat treatment, the intrafurnace atmosphere is replaced by a nitrogen gas.

Step 7: The inside of the furnace is opened to the air, and the wafers are taken out of the furnace.

Where wafers are consecutively subjected to a heat treatment in a hydrogen-gas containing atmosphere as a batch process, step 2 is performed after step 7.

Steps 3 and 6 for replacing the intrafurnace atmosphere with a nitrogen gas are usually performed at 700–800° C., and steps 2 and 7 for inputting/outputting wafers are usually performed approximately at the above temperature. In recent years, attempts of increasing the above temperature have been made to improve the production efficiency.

However, in wafers as subjected to a heat treatment in a hydrogen-gas containing atmosphere, a surface oxide film has been removed to expose the silicon surface. Therefore, there is a problem that if a nitrogen substitution gas is used at a high temperature (more than 800° C.), it easily reacts with silicon of the wafer surface, to form a nitride, in which case wafers become defective and cannot be used anymore. Even in a temperature range of 700–800° C., a nitride film is formed on part of wafers or wafer surfaces are roughened.

Wafers as subjected to a heat treatment in a hydrogen-gas containing atmosphere have very active surfaces, and are therefore prone to be polluted with metal impurities etc. Where a nitrogen substitution gas is used, the surface activity can be reduced by formation of a nitride film, which, however, may cause defective wafers and is therefore not preferable.

When some abnormality in a heat treatment requires urgent discharge of a hydrogen-containing gas from a furnace, a nitride film is formed on every wafer if a nitrogen gas is used for that purpose. Therefore, all the wafers become defective.

It has been attempted in the conventional method to use an argon gas instead of a nitrogen gas. However, due to the problems exemplified below, usually an argon gas is not used positively as a substitution gas. That is, an argon gas available on the market is less pure and more expensive than a nitrogen gas. Experiments have revealed that an argon gas likely makes a wafer surface cloudy, though detailed reasoning has not been made. (Refer to, for instance, "Collection of Safety Data of Semiconductor Process Gases," coauthored by the Special Gas Industrial Society and SEMI Japan, 1991, pp. 2. Further, an argon gas likely roughens a wafer surface.

In summary, the conventional method of using a nitrogen substitution gas is associated with the technical problems that wafers become defective at a high rate, and that the wafer input/output temperature cannot be set high.

While the use of an argon gas can prevent formation of a nitride film, it causes other problems such as surface clouding and roughening.

SUMMARY OF THE INVENTION

The present invention has been made to solve the above problems and, therefore, has an object of providing a silicon wafer manufacturing method which allows silicon wafers to be subjected to a heat treatment in a hydrogen-gas containing atmosphere without causing defects on wafer surfaces.

To attain the above object, according to the invention, there is provided a heat treatment method of a silicon wafer comprising the steps of:

inputting the silicon wafer to a heat treatment furnace in an air atmosphere;

replacing the air atmosphere with a first substitution gas atmosphere of a high-purity inert gas having a water content of not more than 2.57 ppm;

replacing the first substitution gas atmosphere with a hydrogen-gas containing atmosphere;

performing a heat treatment in the hydrogen-gas containing atmosphere;

replacing the hydrogen-gas containing atmosphere with a second substitution gas atmosphere of the high-purity inert gas; and outputting the wafer from the furnace in an air atmosphere.

The high-purity inert gas may be an argon gas having a dew point of not higher than −70° C.

The high-purity inert gas may be a gas or a mixed gas of gases selected from the group consisting of argon, helium, neon, and xenon.

The high-purity inert gas may be one having a water content of not more than 2.57 ppm immediately before it is introduced into the furnace.

The high-purity inert gas may be one having a water content of not more than 2.57 ppm immediately after it is discharged from the furnace.

In the silicon wafer hydrogen heat treatment method of the invention, wafers are input to the furnace in a state of being mounted on a silicon boat from an opened portion of a core tube. Then, the core tube is sealed and the its inside is filled with a high-purity inert gas atmosphere. After oxygen originally contained in the air is completely removed from the furnace in the above manner, a hydrogen-containing gas, i.e., a heat treatment atmosphere is introduced into the core tube to replace the inert gas and a heat treatment is started. After completion of the heat treatment, the inside of the furnace is again filled with a high-purity inert gas atmosphere and the wafers are output from an opened portion of the core tube.

In the invention, since the high-purity inert gas having a water content of not more than 2.57 ppm is used as the substitution gas, the wafer surface is prevented from being roughened. Although the wafer surface as subjected to the heat treatment in the hydrogen-gas containing atmosphere is very active, its activity can be reduced by exposing it to the high-purity inert gas as the substitution gas that is used after the heat treatment. Therefore, it becomes less likely that the wafer surface is polluted with metal impurities in the subsequent steps, and it becomes possible to output the wafers from the furnace at a relatively high temperature.

If the water content of the inert gas exceeds 2.57 ppm, heat-treated wafers will have a rough surface.

Where the inert gas is an argon gas, its dew point should not be higher than −70° C. This is because if it is higher than −70° C., the argon gas necessarily has a water content larger than 2.57 ppm, resulting is heat-treated wafers having a rough surface. It is much preferable that an argon gas having a dew point not higher than −75° C. (water content: not more than 1.2 ppm) be used.

The inert gas as defined in the invention is a gas constituted of the group-VIII elements of the periodic table, and therefore does not include a nitrogen gas.

In the invention, it is preferred that in a wafer input operation, the introduction of the substitution gas be started, at the latest, immediately after the furnace is sealed. It is much preferred that the introduction of the substitution gas into the furnace be started during a wafer input operation. This is to minimize the degree of formation of an oxide film, a nitride film, or the like on wafers, which occurs such that the temperature of the wafers increases as they proceed in the furnace and react with the air.

In the invention, it is desirable that a wafer input operation be performed at a temperature not lower than 650° C. A temperature not lower than 800° C. is more desirable, and a temperature not lower than 900° C. is most desirable. This is because at a temperature lower then 650° C., the low wafer temperature itself suppresses formation of a nitride film or the like as well as surface roughening even without using a high-purity inert gas; that is, the use of the high-purity inert gas is not advantageous. As wafers are input at a higher temperature, the invention's effects of preventing formation of an undesirable film on wafer surfaces and their roughening become more remarkable.

In the invention, it is desirable that the water content value of 2.57 ppm of the high-purity inert gas be a value as measured immediately before it is introduced into the heat treatment furnace. Usually, a gas tube for a wafer heat treatment is made of quartz glass or silicon carbide in portions close to a core tube and of stainless steel in the other portions. Since water is absorbed on stainless steel, even if a high-purity inert gas having a water content of not more than 2.57 ppm is used, water having been absorbed on the gas tube will be mixed into the inert gas while the gas passes through such portions of the tube, to increase the water content of the gas. To prevent this phenomenon, the inside of a stainless gas tube may be subjected to a passivation treatment.

It is more desirable that the water content value of 2.57 ppm of the high-purity inert gas be a value as measured immediately after it is introduced into the heat treatment furnace. This is because the water content may increase due to water generated from the components of the furnace, or water generated due to the reducing action of hydrogen during the heat treatment performed in a hydrogen-gas containing atmosphere.

In the invention, the heat treatment furnace is sealed after wafers are placed therein, and then an inert gas as a substitution gas is introduced into the furnace. The gas substitution time in this operation is set at 1 minute to 1 hour under conditions of the normal pressure and a flow rate of 10–100 l/min, for the following reasons. If it is shorter than 1 minute, it cannot be confirmed that oxygen originally in the air has been discharged completely, which leaves a possibility of hydrogen explosion. On the other hand, even if the gas substitution is performed for-longer than 1 hour, no added improvement in the gas substitution effects is expected.

DESCRIPTION OF THE PREFERRED EMBODIMENTS

Embodiments of the present invention will be hereinafter described.

Figure 1:
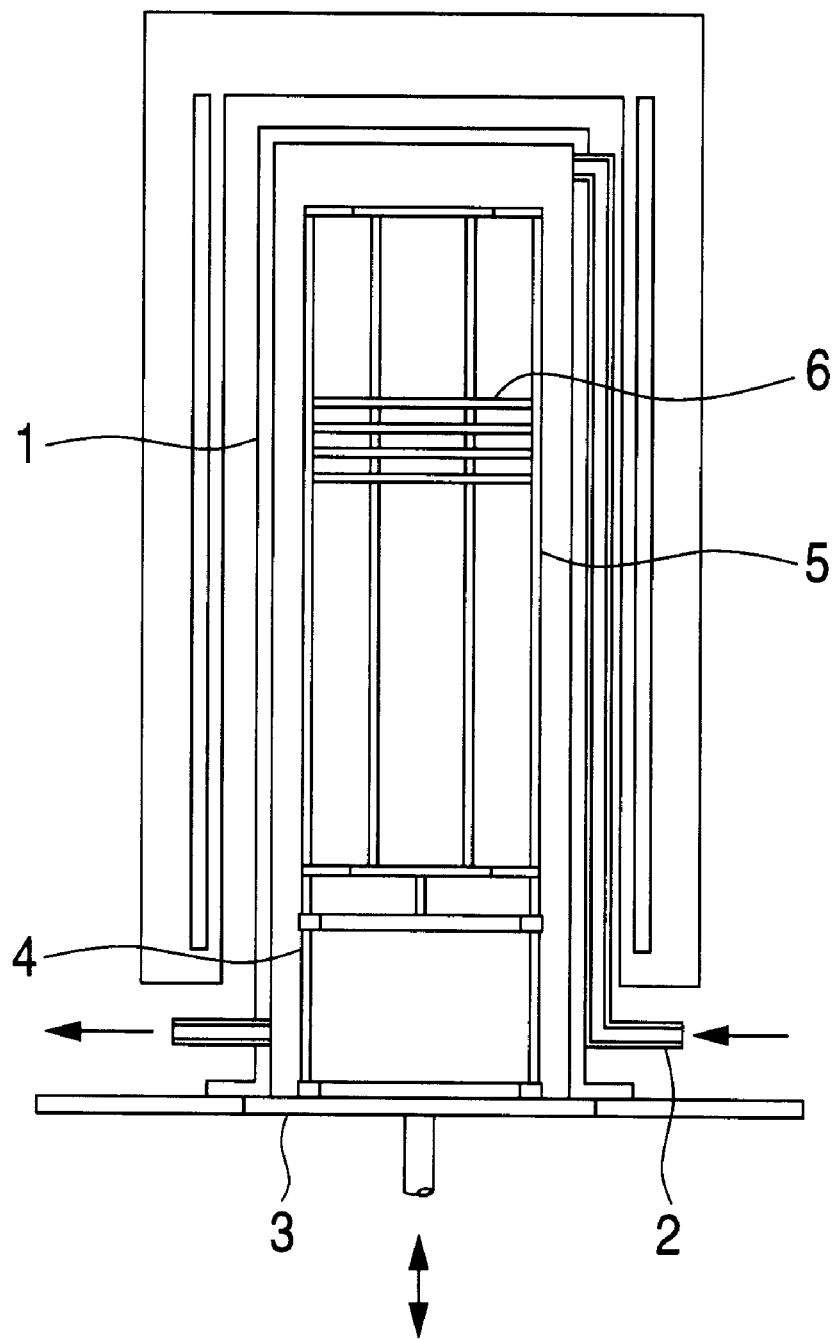
FIG. 1 is a sectional view showing a general configuration of a vertical heat treatment furnace used in a first embodiment of the present invention.

FIG. 1 shows a vertical heat treatment furnace used in the embodiments. A core tube 1 made of quartz glass is fitted with a gas supply tube 2 also made of quartz glass. The gas supply tube 2 is connected to a stainless tube (not shown) whose inside surface has been subjected to a passivation treatment. A hydrogen-containing gas (heat treatment gas) and an inert gas (substitution gas) are introduced into the core tube 1 through the gas supply tube 2.

A bottom portion of the core tube 1 is opened. By bringing the bottom portion into abutment with a lid 3, the inside of the core tube 1 can be sealed. A boat 5 made of silicon that accommodates reflecting plates 4 for heat reservation and silicon wafers 6 is placed on the lid 3. The wafers are input or output as the boat 5 is moved vertically together with the lid 3.

The dew point and the water content of an inert gas being introduced were measured with a dew point meter or a mass spectroscope that was installed at a low-temperature portion of the gas supply tube 2.

The wafers 6 were heat-treated by using the above vertical heat treatment furnace while the kind of substitution gas introduced, the dew point and the water content of the substitution gas, the gas substitution temperature, and the gas substitution time were varied.

The wafers 6 were input to the furnace at a gas substitution temperature in a state of being accommodated in the boat 5 while a substitution gas is introduced from the gas supply tube 2. The substitution gas was introduced for a gas substitution time from a time point when the lid 3 was brought into abutment with the core tube 1 and the core tube 1 was thereby sealed, to fill the inside of the furnace with a substitution gas atmosphere. The temperature was then increased, and a heat treatment was performed at 1,200° C. for 1 hour in a 100% hydrogen gas atmosphere. After completion of the heat treatment, the temperature was reduced to the gas substitution temperature and then the substitution gas was introduced into the furnace. After the intrafurnace atmosphere was replaced by the substitution gas, the lid 3 was lowered and the wafers 6 were taken out (see FIG. 2).

The wafers 6 thus processed were subjected to visual surface inspection using a spot light and measurement of the degree of nitriding with an XPS (X-ray photoelectron spectroscope) or by ellipsometry.

Tables 1–5 show results of the above experiments.

TABLE 1

| No. | Subst. gas | Dew point and water content of subst. gas | | Subst. temp. (° C.) | Subst. time (min) | Inspection/measurement results | |
|---|---|---|---|---|---|---|---|
| | | Dew point (° C.) | Water content (ppm) | | | Visual inspection | Nitriding |
| 1 | Argon | −65 | 5 | 500 | 1 | Surface roughening (partial) | None |
| 2 | | | | 550 | | " | |
| 3 | | | | 600 | | " | |
| 4 | | | | 650 | | " | |
| 5 | | | | 700 | | Surface roughening | |
| 6 | | | | 750 | | " | |
| 7 | | | | 800 | | " | |
| 8 | | | | 850 | | " | |
| 9 | | | | 900 | | " | |
| 10 | | | | 950 | | " | |
| 11 | | | | 1000 | | " | |
| 12 | | | | 1100 | | " | |
| 13 | | | | 1200 | | " | |
| 14 | Argon | −65 | 5 | 500 | 60 | Surface roughening (partial) | None |
| 15 | | | | 550 | | " | |
| 16 | | | | 600 | | " | |
| 17 | | | | 650 | | " | |
| 18 | | | | 700 | | Surface roughening | |
| 19 | | | | 750 | | " | |
| 20 | | | | 800 | | " | |
| 21 | | | | 850 | | " | |
| 22 | | | | 900 | | " | |
| 23 | | | | 950 | | " | |
| 24 | | | | 1000 | | " | |
| 25 | | | | 1100 | | " | |
| 26 | | | | 1200 | | " | |

TABLE 2

| No. | Subst. gas | Dew point and water content of subst. gas | | Subst. temp. (° C.) | Subst. time (min) | Inspection/measurement results | |
|---|---|---|---|---|---|---|---|
| | | Dew point (° C.) | Water content (ppm) | | | Visual inspection | Nitriding |
| 27 | Argon | −65 | 5 | 500 | 120 | Surface roughening (partial) | None |
| 28 | | | | 550 | | | |
| 29 | | | | 600 | | | |
| 30 | | | | 650 | | | |
| 31 | | | | 700 | | | |
| 32 | | | | 750 | | | |
| 33 | | | | 800 | | | |
| 34 | | | | 850 | | | |
| 35 | | | | 900 | | | |
| 36 | | | | 950 | | | |
| 37 | | | | 1000 | | | |
| 38 | | | | 1100 | | | |
| 39 | | | | 1200 | | | |
| 40 | Argon | −70 | 2.57 | 500 | 1 | Good | None |
| 41 | | | | 550 | | | |
| 42 | | | | 600 | | | |
| 43 | | | | 650 | | | |

TABLE 2-continued

| | | Dew point and water content of subst. gas | | | | Inspection/measurement results | |
|---|---|---|---|---|---|---|---|
| No. | Subst. gas | Dew point (° C.) | Water content (ppm) | Subst. temp. (° C.) | Subst. time (min) | Visual inspection | Nitriding |
| 44 | | | | 700 | | | |
| 45 | | | | 750 | | | |
| 46 | | | | 800 | | | |
| 47 | | | | 850 | | | |
| 48 | | | | 900 | | | |
| 49 | | | | 950 | | | |
| 50 | | | | 1000 | | | |
| 51 | | | | 1100 | | | |
| 52 | | | | 1200 | | | |

TABLE 3

| | | Dew point and water content of subst. gas | | | | Inspection/measurement results | |
|---|---|---|---|---|---|---|---|
| No. | Subst. gas | Dew point (° C.) | Water content (ppm) | Subst. temp. (° C.) | Subst. time (min) | Visual inspection | Nitriding |
| 53 | Argon | −70 | 2.57 | 500 | 60 | Good | None |
| 54 | | | | 550 | | | |
| 55 | | | | 600 | | | |
| 56 | | | | 650 | | | |
| 57 | | | | 700 | | | |
| 58 | | | | 750 | | | |
| 59 | | | | 800 | | | |
| 60 | | | | 850 | | | |
| 61 | | | | 900 | | | |
| 62 | | | | 950 | | | |
| 63 | | | | 1000 | | | |
| 64 | | | | 1100 | | | |
| 65 | | | | 1200 | | | |
| 66 | Argon | −70 | 2.57 | 500 | 120 | Good | None |
| 67 | | | | 550 | | | |
| 68 | | | | 600 | | | |
| 69 | | | | 650 | | | |
| 70 | | | | 700 | | | |
| 71 | | | | 750 | | | |
| 72 | | | | 800 | | | |
| 73 | | | | 850 | | | |
| 74 | | | | 900 | | | |
| 75 | | | | 950 | | | |
| 76 | | | | 1000 | | | |
| 77 | | | | 1100 | | | |
| 78 | | | | 1200 | | | |

TABLE 4

| | | Dew point and water content of subst. gas | | | | Inspection/measurement results | |
|---|---|---|---|---|---|---|---|
| No. | Subst. gas | Dew point (° C.) | Water content (ppm) | Subst. temp. (° C.) | Subst. time (min) | Visual inspection | Nitriding |
| 79 | Argon | −75 | 1.2 | 500 | 1 | Good | None |
| 80 | | | | 550 | | | |
| 81 | | | | 600 | | | |
| 82 | | | | 650 | | | |
| 83 | | | | 700 | | | |
| 84 | | | | 750 | | | |

TABLE 4-continued

| No. | Subst. gas | Dew point (° C.) | Water content (ppm) | Subst. temp. (° C.) | Subst. time (min) | Visual inspection | Nitriding |
|---|---|---|---|---|---|---|---|
| 85 | | | | 800 | | | |
| 86 | | | | 850 | | | |
| 87 | | | | 900 | | | |
| 88 | | | | 950 | | | |
| 89 | | | | 1000 | | | |
| 90 | | | | 1100 | | | |
| 91 | | | | 1200 | | | |
| 92 | Argon | −75 | 1.2 | 500 | 60 | Good | None |
| 93 | | | | 550 | | | |
| 94 | | | | 600 | | | |
| 95 | | | | 650 | | | |
| 96 | | | | 700 | | | |
| 97 | | | | 750 | | | |
| 98 | | | | 800 | | | |
| 99 | | | | 850 | | | |
| 100 | | | | 900 | | | |
| 101 | | | | 950 | | | |
| 102 | | | | 1000 | | | |
| 103 | | | | 1100 | | | |
| 104 | | | | 1200 | | | |

TABLE 5

| No. | Subst. gas | Dew point (° C.) | Water content (ppm) | Subst. temp. (° C.) | Subst. time (min) | Visual inspection | Nitriding |
|---|---|---|---|---|---|---|---|
| 105 | Argon | −75 | 1.2 | 500 | 120 | Good | None |
| 106 | | | | 550 | | | |
| 107 | | | | 600 | | | |
| 108 | | | | 650 | | | |
| 109 | | | | 700 | | | |
| 110 | | | | 750 | | | |
| 111 | | | | 800 | | | |
| 112 | | | | 850 | | | |
| 113 | | | | 900 | | | |
| 114 | | | | 950 | | | |
| 115 | | | | 1000 | | | |
| 116 | | | | 1100 | | | |
| 117 | | | | 1200 | | | |
| 118 | Nitrogen | −70 | 2.57 | 500 | 1 | Good | None |
| 119 | | | | 550 | | Good | None |
| 120 | | | | 600 | | Good | None |
| 121 | | | | 650 | | Good | None |
| 122 | | | | 700 | | Good | Found |
| 123 | | | | 750 | | Surface roughening (partial) | Found |
| 124 | | | | 800 | | " | Found |
| 125 | | | | 850 | | " | Found |
| 126 | | | | 900 | | Surface roughening (all) | Found |
| 127 | | | | 950 | | " | Found |
| 128 | | | | 1000 | | " | Found |
| 129 | | | | 1100 | | " | Found |
| 130 | | | | 1200 | | " | Found |

Lot numbers 1 to 39 are comparative examples in which the substitution gas is an argon gas having a dew point of −65° C. and a water content of 5 ppm. Lot numbers 118 to 130 are also comparative examples in which the substitution gas is a nitrogen gas having a dew point of −70° C. and a water content of 2.57 ppm.

As is understood from Tables 1–5, where a nitrogen substitution gas is used, nitriding was found in wafers that were processed at a temperature of 700° C. or more.

On the other hand, where an argon substitution gas was used, roughening of silicon wafer surfaces was found in wafers that were processed under conditions that the dew point is higher than −70° C. and the water content is larger than 2.57 ppm.

No apparent difference was found between two cases where the gas substitution time is 1 minute and 120 minutes, respectively.

Figure 2:
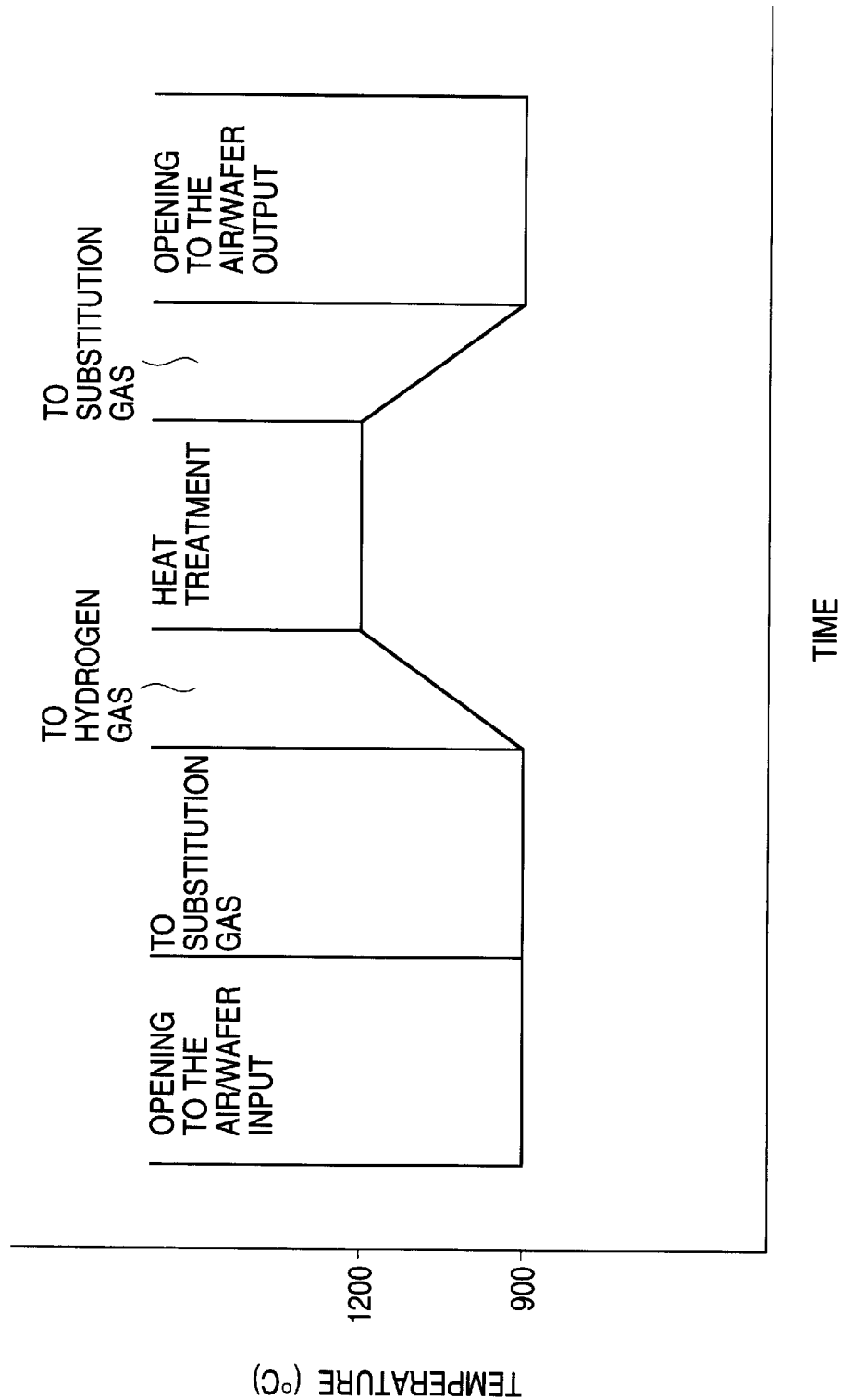
FIG. 2 shows an example of a heat treatment procedure according to the first embodiment of the invention.
Figure 3:
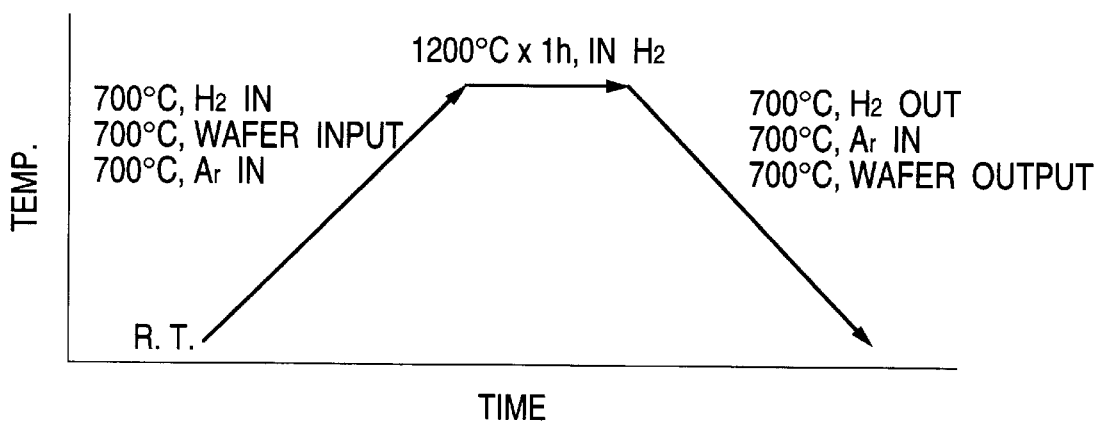
FIGS. 3–6 show heat treatment procedures according to other embodiments of the invention.
Figure 4:
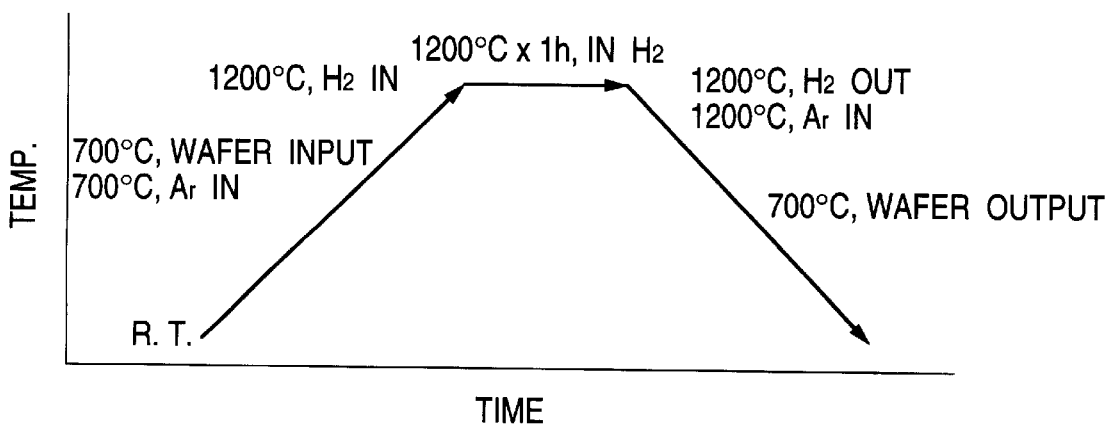
Figure 5:
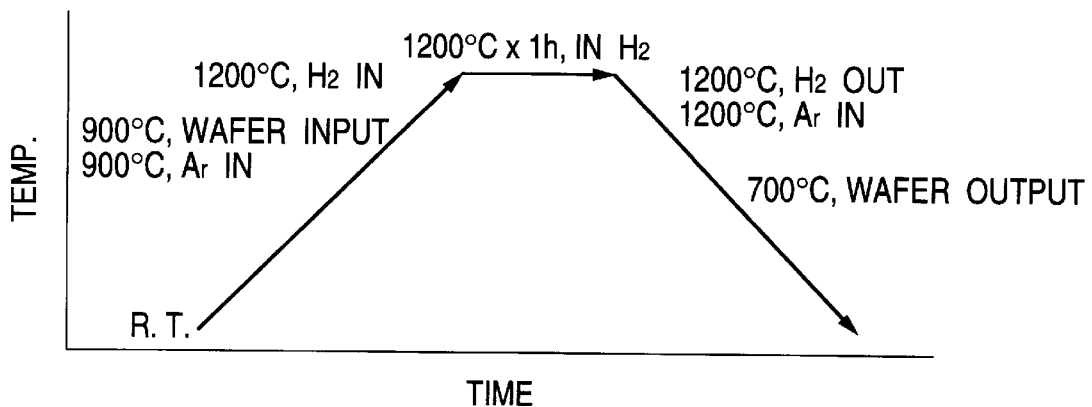
Figure 6:
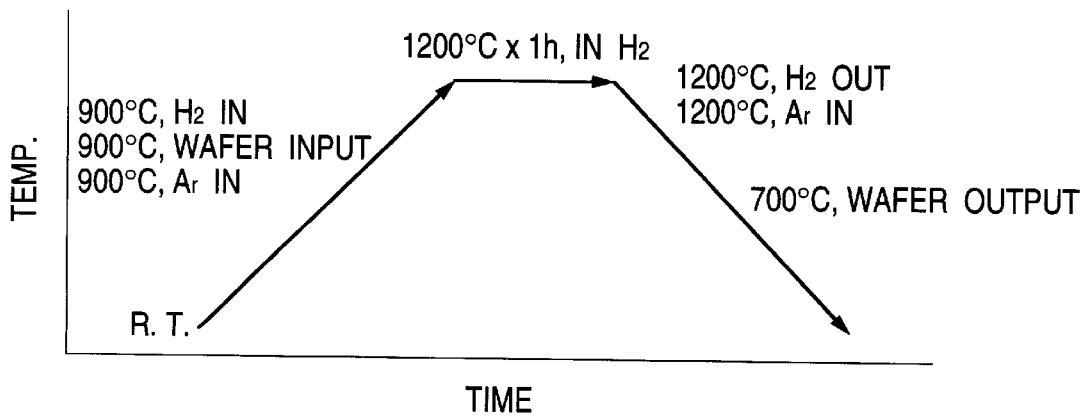

In the above embodiment (experiments), the wafer input temperature, the gas substitution temperature for wafer output, and the wafer output temperature are the same as exemplified in FIG. 2. However, they may be made different as shown in FIGS. 3–6. To prevent formation of an oxide film, it is desirable that the gas substitution is performed immediately after completion of the wafer input at the latest.

As described above, according to the silicon wafer manufacturing method of the invention, no nitride film is formed and the wafer surface is not made rough. Since the wafer surface immediately after being subjected to a heat treatment in a hydrogen-gas containing atmosphere is exposed to an inert gas, it can be rendered inactive and therefore be prevented from being polluted with metal impurities etc. As a result, it becomes possible to provide wafers that can improve the reliability of semiconductor devices and accommodate their miniaturization and an increased degree of integration.

What is claimed is:

1. A heat treatment method of a silicon wafer, comprising the steps of:

inputting the silicon wafer into a heat treatment furnace in an air atmosphere;

replacing the air atmosphere with a first substitution gas atmosphere of a high-purity inert gas selected from the group consisting of group VIII elements having a water content substantially less than or equal to 2.57 ppm;

replacing the first substitution gas atmosphere with a hydrogen-gas containing atmosphere;

performing a heat treatment in the hydrogen-gas containing atmosphere;

replacing the hydrogen-gas containing atmosphere with a second substitution gas atmosphere of the high-purity inert gas selected from the group consisting of group VIII elements; and outputting the wafer from the furnace in an air atmosphere.

2. The heat treatment method according to claim 1, wherein the high-purity inert gas is an argon gas having a dew point substantially less than or equal to −70° C.

3. The heat treatment method according to claim 1, wherein the high-purity inert gas is a gas or a mixed gas of gases selected from the group consisting of argon, helium, neon, and xenon.

4. The heat treatment method according to claim 1, wherein the high-purity inert gas has the water content substantially less than or equal to 2.57 ppm immediately before it is introduced into the furnace.

5. The heat treatment method according to claim 1, wherein the high-impurity inert gas has the water content substantially less than or equal to 2.57 ppm immediately after it is discharged from the furnace.

* * * * *